United States Patent
Misawa

(10) Patent No.: US 7,384,812 B2
(45) Date of Patent: Jun. 10, 2008

(54) METHOD OF MANUFACTURING A SEMICONDUCTOR DEVICE WITH LIGHT SHADING MEANS

(75) Inventor: Takeshi Misawa, Saitama (JP)

(73) Assignee: Fujifilm Corporation, Tokyo (JP)

( * ) Notice: Subject to any disclaimer, the term of this patent is extended or adjusted under 35 U.S.C. 154(b) by 47 days.

(21) Appl. No.: 11/353,003

(22) Filed: Feb. 14, 2006

(65) Prior Publication Data
US 2006/0125037 A1    Jun. 15, 2006

Related U.S. Application Data

(62) Division of application No. 10/620,461, filed on Jul. 17, 2003, now Pat. No. 7,332,783.

(30) Foreign Application Priority Data
Jul. 17, 2002   (JP) ............ P. 2002-208550

(51) Int. Cl.
H01L 21/30 (2006.01)
H01L 21/18 (2006.01)
(52) U.S. Cl. .............. 438/66; 257/E21.212; 438/459
(58) Field of Classification Search .......... 438/459, 438/460
See application file for complete search history.

(56) References Cited

U.S. PATENT DOCUMENTS 5,122,905 A   6/1992  Wheatley et al.
5,273,940 A * 12/1993 Sanders ............... 438/107
5,453,876 A   9/1995  Hamada
5,523,174 A   6/1996  Tamaki
5,656,552 A * 8/1997  Hudak et al. .......... 438/15
6,168,965 B1* 1/2001  Malinovich et al. ..... 438/66
6,200,908 B1   3/2001  Vandamme et al.
6,338,974 B1   1/2002  Strnad
6,395,124 B1   5/2002  Oxman et al.
6,583,444 B2   6/2003  Fjelstad
6,782,610 B1   8/2004  Iijima et al.

FOREIGN PATENT DOCUMENTS

| JP | 1-120077 A | 5/1989 |
| JP | 2077157 | 3/1990 |
| JP | 2089368 | 3/1990 |
| JP | 3021859 | 3/1991 |
| JP | 4-37053 A | 2/1992 |
| JP | 5-175539 A | 7/1993 |
| JP | 7-202152 A | 8/1995 |
| JP | 2002-26301 A | 1/2002 |

* cited by examiner

Primary Examiner—W. David Coleman
(74) Attorney, Agent, or Firm—Birch, Stewart, Kolasch & Birch, LLP

(57) ABSTRACT

The semiconductor device according to this invention is characterized by a package structure of a semiconductor substrate 100 equipped with a photoelectric converting portion, wherein a light-shading means 104 is arranged in an area corresponding to at least the photoelectric converting portion on the side of the rear surface of the semiconductor substrate.

2 Claims, 7 Drawing Sheets

METHOD OF MANUFACTURING A SEMICONDUCTOR DEVICE WITH LIGHT SHADING MEANS

BACKGROUND OF THE INVENTION

This application is a Divisional of application Ser. No. 10/620,461, filed on Jul. 17, 2003 now U.S. Pat. No. 7,332,783, the entire contents of which are hereby incorporated by reference and for which priority is claimed under 35 U.S.C. § 120.

1. Field of the Invention

This invention relates to a semiconductor device and a method for manufacturing the same, and more particularly to a semiconductor device having a photoelectric converting portion such as a solid-state image pick-up device.

2. Description of the Related Art

The solid-state image pick-up device inclusive of a CCD (charge coupled device) has been increasingly required to decrease its size in view of the necessity of its application to a portable telephone and digital camera.

As a typical example of the application, a solid-state image pick-up device has been proposed which is provided with a micro-lens in the light receiving area of a semiconductor chip. Specifically, it is proposed to downsize the solid-state image pick-up device provided with a micro-lens in the light receiving area by integrally packaging a hermetic-sealing portion between the light receiving area and micro-lens of the solid-state image pick-up device (JP-A-7-202152).

Such an arrangement can reduce the packaging area, and optical components such as a filter, lens, prism, etc. can be bonded onto the surface of the hermetic sealing portion. Thus, down-sizing of the package can be accomplished without deteriorating the light-gathering capability of the micro-lens.

However, such an arrangement also presents various problems.

In mounting the solid-state image pick-up device, in order to take out a signal externally, the solid-state image pick-up device mounted on a supporting substrate is subjected to electric connection and sealing by e.g. bonding.

In order to satisfy the demand for improvement of resolution, various peripheral circuits are required. Where substrates for the peripheral circuits are stacked, a problem of noise due to signal transfer from the peripheral circuits to the solid-state image pick-up device or from the solid-state image pick-up device to the peripheral circuits has become obvious. Therefore, reduction in the wiring length is an important problem to be solved.

In order to enhance the driving speed, in recent years, the semiconductor chip has been low-profiled to about 200 μm. Correspondingly, the problem of reduction in the strength of the semiconductor chip or mixing of an erroneous signal in the output signal from the solid-state image pick-up device, which is attributable to the penetration of a circuit pattern such as a bump on the rear surface of the semiconductor chip through the semiconductor chip, has become serious.

This problem also occurs in other various photoelectric conversion devices such as a photo-sensor having a pin structure. This problem is a very serious problem in recent years when the low-profiling of the semiconductor chip has been advanced explosively.

SUMMARY OF THE INVENTION

In view of such a circumstance, this invention has been accomplished for the objects to provide a semiconductor device with a compact size, high driving speed and high reliability.

This invention is also intended to provide a semiconductor device which can be easily manufactured and has high reliability.

The semiconductor device according to this invention has a semiconductor substrate equipped with a photoelectric converting portion, and is characterized by a package structure, wherein a light-shading means is arranged in an area corresponding to at least the photoelectric converting portion on the side of the rear surface of the semiconductor substrate.

In accordance with such a configuration, since the light shading means is formed on the rear surface of the semiconductor substrate, even when the semiconductor substrate is thin, the light reflected from the rear surface is prevented from being incident on the photoelectric converting portion, thereby providing a semiconductor device which generates less malfunction and is reliable.

Preferably, the package structure may be a wiring board with a connecting terminal formed on the rear surface.

In the case of the wiring board with a connecting terminal formed on the rear surface, the image of the connecting terminal such as a bump is prevented from permeating a thin semiconductor substrate to be incident on the photoelectric converting portion thereby to cause malfunction.

Preferably, the light shading means may be formed by making rough the area corresponding to the photoelectric converting portion on the rear surface of the semiconductor substrate. In accordance with this configuration, light diffusion can be produced on the rear surface of the semiconductor substrate, thereby preventing light from reaching the photoelectric converting portion.

Preferably, the light shading means may be a multi-layer film composed of films with different refraction indices formed on the area corresponding to the photoelectric converting portion on the rear surface of the semiconductor substrate. In accordance with this configuration, a reflective film can be easily formed, thereby preventing light from reaching the photoelectric converting portion.

Preferably, the light shading means may be a light-shading film formed on the rear surface of the semiconductor substrate, thereby preventing light from reaching the photoelectric converting portion.

Preferably, the wiring board may be connected to the semiconductor substrate through a light-shading resin material, thereby easily preventing light from reaching the photoelectric converting portion.

Preferably, the wiring board may be made rough in the surface, thereby preventing light from reaching the photoelectric converting portion.

Further, the wiring board may include a light shading layer in the interior or on the rear surface, thereby preventing light from reaching the photoelectric converting portion.

The method for manufacturing a semiconductor device according to this invention comprises the steps of: forming a plurality of semiconductor devices on the front surface of a semiconductor substrate; bonding a wiring board on the rear surface of the semiconductor substrate; and separating a bonding structure obtained by bonding into semiconductor devices, and is characterized by comprising the step of grinding the rear surface of the semiconductor substrate.

In accordance with such a method, the rear surface of the semiconductor substrate has only to be made rough to produce light diffusion on the rear surface of the semiconductor substrate, thereby providing a semiconductor device with high reliability.

The method for manufacturing a semiconductor device is characterized by comprising the steps of: forming a plurality of semiconductor devices on the front surface of a semiconductor substrate; bonding a wiring board on the rear surface of the semiconductor substrate through light-shading adhesive; and separating a bonding structure obtained by bonding into semiconductor devices.

In accordance with such a configuration, the light shading resin has only to be employed as adhesive for bonding in the CSP step.

Further, a structure may be adopted in which a peripheral circuit is stacked on a supporting member and electric connection is made between the solid-state image pick-up device board and a peripheral circuit board through a through-hole made in the solid-state image pick-up device board and a supporting member. Such a structure permits the entire device to be miniaturized and the distance between the solid-state image pick-up device and the peripheral circuit board to be shortened. Therefore, the wiring resistance is reduced so that the driving speed can be increased. Further, by using the supporting member made of a light-shading material, the light reflected from the rear surface of the solid-state image pick-up device can be suppressed more surely.

Further, by also making unevenness such as by grinding the rear surface of the solid-state image pick-up device, it is possible to suppress the influence of the light reflected from the rear surface on the output from the solid-state image pick-up device. Furthermore, the light-shading film such as a tungsten film formed on the rear surface of the solid-state image pick-up device through an oxide film may be as the supporting member.

Further, the multi-layer film may be formed on the rear surface of the solid-state image pick-up device. This suppress the influence of the light reflected from the rear surface on the output from the solid-state image pick-up device.

In addition, the light-shading resin such epoxy resin may be applied to the rear surface of the solid-state image pick-up device.

Furthermore, unevenness may be formed on the surface of the supporting member (reinforcement member). The light-shading material such as epoxy resin may be employed as the adhesive for connection to the peripheral circuit board.

Preferably, the supporting member includes a reinforcement plate.

Further, if the supporting member includes a heat insulating material, it is possible to prevent the peripheral circuit board from malfunctioning owing to the heat generation of the solid-state image pick-up device board, or otherwise the solid-state image pick-up device board from malfunctioning owing to the heat generation of the peripheral circuit board. Preferably, if the supporting member includes a shielding plate, unnecessary radiation noise can be suppressed.

Preferably, if the semiconductor substrate is bonded to the peripheral circuit board through a magnetic shield plate, it is possible to prevent the semiconductor substrate from suffering the noise due to unnecessary radiation from the peripheral circuit board, and the peripheral circuit board from suffering the noise due to the unnecessary radiation from the solid-state image pick-up device board.

BRIEF DESCRIPTION OF THE DRAWINGS

FIGS. 9(a) to 8(c) are views showing the steps for manufacturing the solid-state image pick-up device according to the seventh embodiment of this invention.

FIGS. 10(a) to 8(d) are views showing the steps for manufacturing the solid-state image pick-up device according to the seventh embodiment of this invention.

DESCRIPTION OF THE PREFERRED EMBODIMENTS

Figure 1:
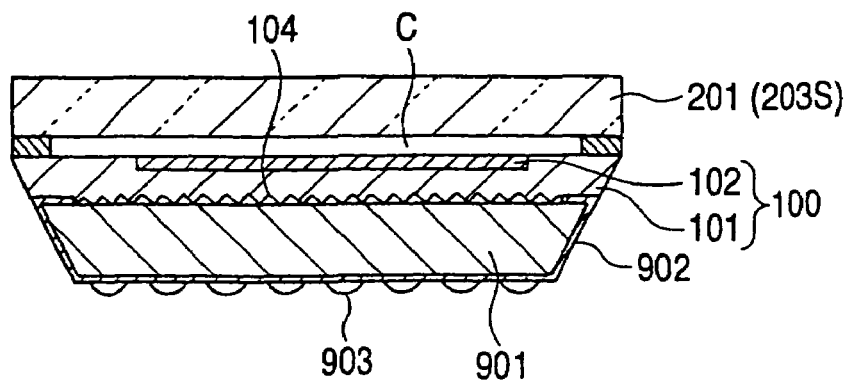
FIG. 1 is a sectional view of a solid-state image pick-up device according to the first embodiment of this invention.

Now referring to the drawings, an explanation will be given of various embodiments of this invention.

Embodiment 1

This solid-state image pick-up device, as shown in a sectional view of FIG. 1, is designed so that a glass substrate 201 which serves as a translucent member is bonded on the surface of a solid-state image pick-up device board 100, which is a silicon substrate 101 with a solid-state image pick-up device 102 formed thereon, through a space 203S to provide a gap C corresponding to a light receiving area which constitutes a photo-diode in the silicon substrate 101; the rear surface of the silicon substrate 101 is made rough to form an uneven area 104 which is connected to a peripheral circuit board 901 formed on the rear surface of the solid-state image pick-up device board 100; and bumps 903 serving as external extending terminals are formed on a wiring layer 902 formed on the peripheral circuit board 901. In this structure, the solid-state image pick-up device has a thickness of about 130 µm and the peripheral circuit board 901 has a thickness of about 200 µm.

The spacer 203s has a height of 30-500 µm, preferably 80-120 µm.

In this structure, the unevenness is formed on the rear surface of the solid-state image pick-up device board. For this reason, light is diffused to prevent the light from reaching the photoelectric converting portion.

Embodiment 2

Figure 2:
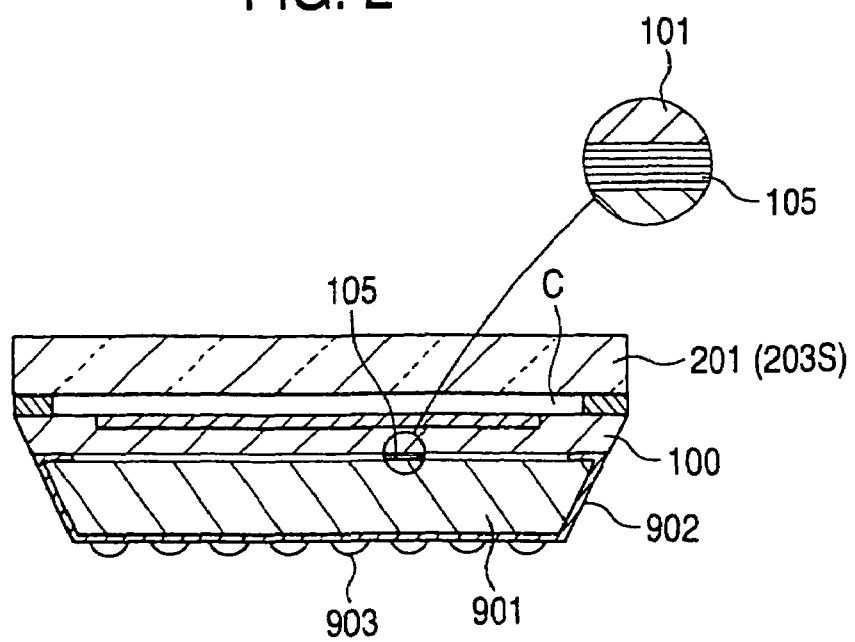
FIG. 2 is a sectional view of a solid-state image pick-up device according to the second embodiment of this invention.

This solid-state image pick-up device as shown in a sectional view of FIG. 2, is designed so that a multi-layer 105 composed of thin films having different refractive indices is formed in an area corresponding to a photodiode portion on the rear surface of a solid-state image pick-up device board 100, which composed of a silicon substrate 101 and a solid-state image pick-up device 102 formed thereon. The remaining portion is formed in the same manner as in the first embodiment.

In this structure, a reflective film can be easily formed, thereby preventing images of the bumps on the rear surface from reaching the photodiode portion.

Embodiment 3

Figure 3:
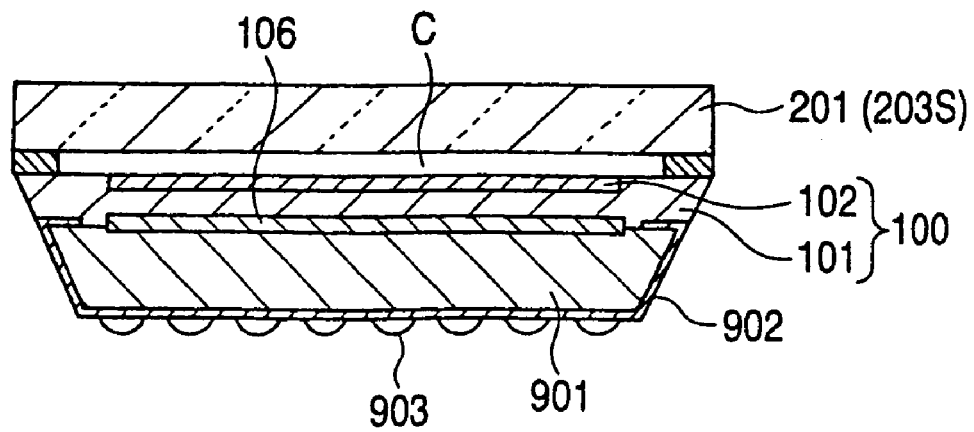
FIG. 3 is a sectional view of a solid-state image pick-up device according to the third embodiment of this invention.
Figure 4:
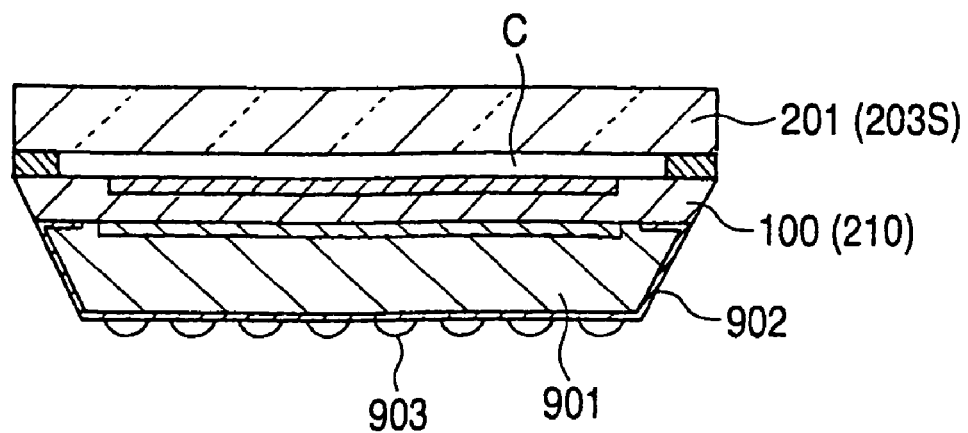
FIG. 4 is a sectional view of a solid-state image pick-up device according to the fourth embodiment of this invention.

In place of the multi-layer 105, as shown in FIG. 3, a light-shading film 106 of a tungsten film is formed on the rear surface of the solid-state image pick-up device board 100, thereby preventing images of the bumps on the rear surface from reaching the photodiode portion. The remaining portion is formed in the same manner as in the first embodiment.

Embodiment 4

In this embodiment, the solid-state image pick-up device board has no film formed thereon, and its rear surface is not made rough. In place of this, an adhesive resin layer formed on the peripheral circuit board 901 to be connected to the rear surface of the solid-state image pick-up device board 100 is made of epoxy resin 210. The remaining portion is formed in the same manner as in the first embodiment.

Such a structure prevents images of the bumps on the rear surface from reaching the photodiode portion.

In addition to the configuration of each of the first to third embodiments, the adhesive resin layer may be made of light-shading resin.

Embodiment 5

Figure 5:
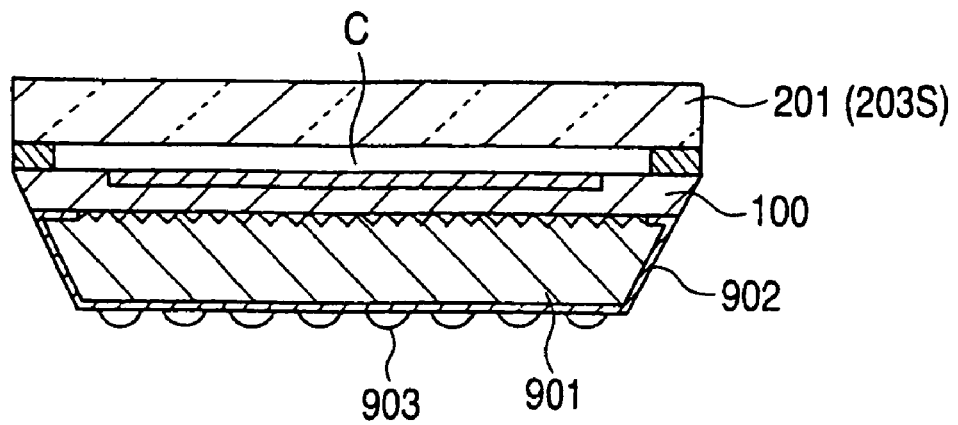
FIG. 5 is a sectional view of a solid-state image pick-up device according to the fifth embodiment of this invention.

In this embodiment, the solid-state image pick-up device board has no film formed thereon, and its rear surface is not made rough. In place of this, as shown in FIG. 5, the surface of the peripheral circuit board 901 to be connected to the rear surface of the solid-state image pick-up device board 100 is made rough. Such a structure also prevents light from reaching the photodiode portion. The remaining portion is formed in the same manner as in the first embodiment.

Such a structure can prevent images of the bumps on the rear surface from reaching the photodiode portion.

This embodiment may be also added to the first to forth embodiments.

Embodiment 6

Figure 6:
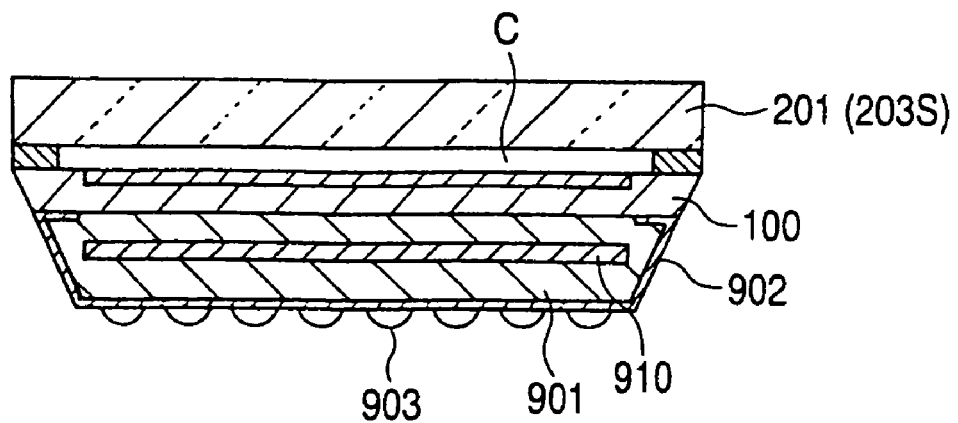
FIG. 6 is a sectional view of a solid-state image pick-up device according to the sixth embodiment of this invention.

In this embodiment, the solid-state image pick-up device board has no film formed thereon, and its rear surface is not made rough. In place of this, as shown in FIG. 6, a light-shading film 910 is formed within the peripheral circuit board 901 to be connected to the rear surface of the solid-state image pick-up device board 100. Such a structure also prevents light from reaching the photodiode portion. The remaining portion is formed in the same manner as in the first embodiment.

Such a structure can prevent images of the bumps on the rear surface from reaching the photodiode portion.

Preferably, the light-shading film may be formed on the rear surface of the peripheral circuit board 901.

Embodiment 7

Figure 7:
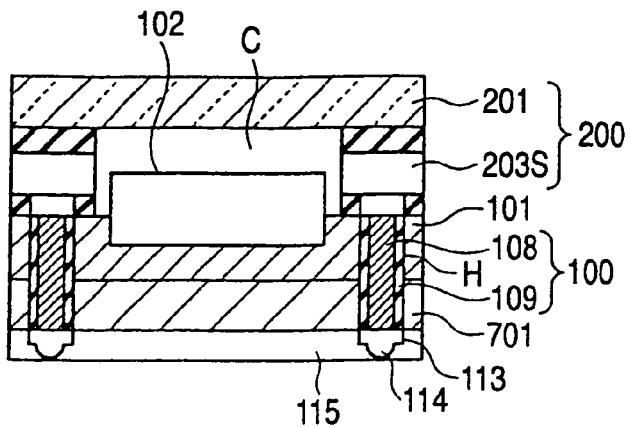
FIGS. 7(a) and 7(b) are a sectional view of a main-part enlarged sectional view of a solid-state image pick-up device according to the seventh embodiment of this invention.
Figure 7:
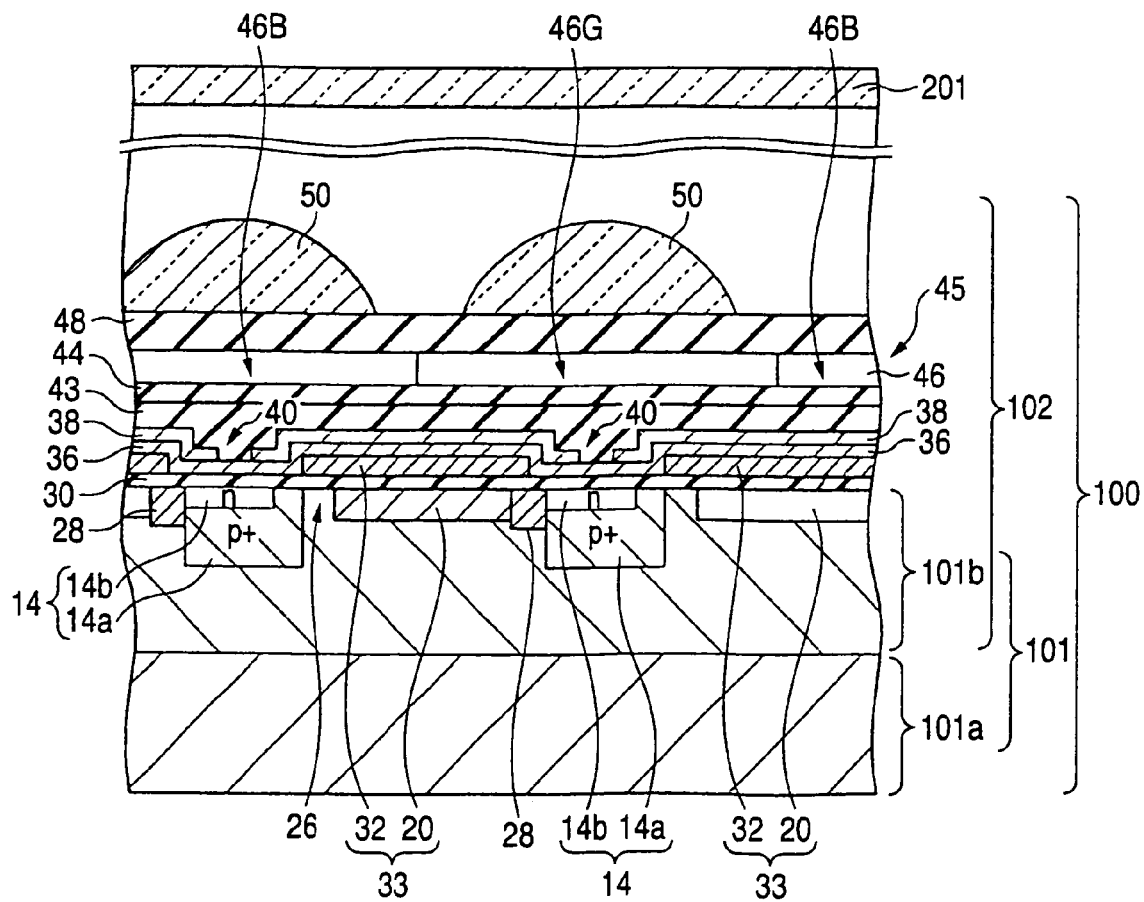

As shown in a sectional view of FIG. 7(*a*) and a main-part enlarged sectional view of FIG. 7(*b*), this solid-state image pick-up device is designed so that a glass substrate 201 which serves as a translucent member is bonded on the surface of a solid-state device board 100, which is a silicon substrate 101 with a solid-state image pick-up device 102 formed thereon, through a space 203S to provide a gap C corresponding to a photo-diode area (light receiving area) in the silicon substrate 101; the electrode of the solid-state image pick-up device is extended out through a through-hole H formed on the silicon substrate 101 to the rear surface of the solid-state image pick-up board 100; a reinforcement plate 701 which is a supporting member made of light-shading material is formed on the rear surface of the solid-state image pick-up device board 100; and pads 113 and bumps 114 which serve as external extending terminals are formed on the reinforcement plate 701. The peripheral circuit board 901 (see FIG. 10*d*) is connected to the rear side of the reinforcement plate 701 through an anisotropic conductive film 115. Its peripheral edges are individually separated by dicing and the external connections for the individual segments are made through bonding pads 118 (see FIG. 10*d*). The spacer 203S has a height of 30-500 mm, preferably 80-120 mm. In accordance with this embodiment, since the reinforcement plate 701 incorporates a light-shading plate, the light-shading capability can be improved without using any separating component.

The solid-state image pick-up device board 100, as seen from a main part enlarged-sectional view of FIG. 7(*b*), is a silicon substrate 101 on the surface of which solid-state image pick-up devices are arranged and a color filter 46 and micro-lenses 50 are formed. Incidentally, although the through-holes H is not seen in this section, it is formed to be connected to a charge transfer electrode 32.

The solid-state image pick-up device board 100 is so designed that a channel stopper 28 is formed in a p type well 101*b* formed on the surface of an n-type silicon substrate 101*a*, and a photodiode 14 and the charge transfer device 33 are formed so as to sandwich the channel stopper 28 therebetween. In this embodiment, an n type impurity regions 14*b* are formed within p+ channel regions 14*a* to provide photodiodes 14. Further, vertical charge transfer channels 20, each of which is an n type impurity region having a depth of about 0.3 μm, are formed within the p+ channel regions 14*a*, and vertical charge transfer electrodes 32 each made from a polysilicon layer are formed on the vertical charge transfer channels 20 through a gate insulating film 30 made from a silicon oxide film, thereby providing charge transfer devices 33. A read-out gate channel 26 made from a p type impurity region is formed between the charge transfer device 33 and the photodiode 14 on the side of reading a signal charge to the vertical charge transfer channel 20. The through-hole H (not shown in FIG. 7) is formed to be connected to the vertical charge transfer electrode 32.

The n type impurity region 14*a* is exposed along the read gate channel 26 on the surface of the silicon substrate 101. Therefore, the signal charge generated in the photodiode 14, after having been temporarily stored in the n type impurity region 14*a*, is read out through the read channel gate 26.

On the other hand, the channel stopper 28 made of a p+ type impurity region resides between the vertical charge transfer channel 20 and the other photodiode 14. Thereby, the photodiode 14 and the vertical charge transfer channel 20 are electrically separated from each other, and the vertical charge transfer channels 20 are separated from each other so as not to be in contact with each other.

Further, the vertical charge transfer electrode 32 covers the read gate channel 26 and is so formed that the n type impurity region is exposed and the channel stopper 28 is partially exposed. A signal charge is transferred from the read gate channel 26 below the portion of the vertical charge transfer electrode 32 to which a read signal is applied.

The vertical charge transfer electrode 32 as well as the vertical charge transfer channel 20 constitutes a vertical charge transfer device (VCCD) 33 which vertically transfers the signal charge generated in the pn junction of the photodiode 14. The surface of the substrate on which the vertical charge transfer electrode 32 is formed is covered with a surface protection film 36. On the surface protection film 36, a light-shading film of tungsten is formed. Only a light receiving region 40 of the photodiode is opened and the remaining region is shaded from light.

The vertical charge transfer electrode 32 is overlaid with a flattening insulating film 43 for surface flattening and a translucent resin film 44 thereon. The translucent resin film 44 is overlaid with a filter layer 46. The filter layer 46 is composed of a red filter layer 46R, a green filter layer 46G and a blue filter layer 46B which are successively arranged correspondingly to the respective photodiodes 14 to provide a prescribed pattern.

The filter layer 46 is overlaid with translucent resin containing photosensitive resin of a refractive index of 1.3-2.0 through a flattening insulating layer 48. The translucent resin is patterned by photolithography and thereafter molten to be rounded by surface tension. The molten translucent resin is cooled to form a micro-lens array consisting of micro-lenses 50. Thus, the filter layer 46 is overlaid with the micro-lens array through the insulating film 48.

An explanation will be given of a process for manufacturing the solid-state image pick-up device. This process, as seen from flowcharts of FIGS. 8(a) to 8(d) and FIGS. 9(a) to 9(d), is based on the CSP (chip size packaging) technique in which a wafer is subjected to positioning and unified with the reinforcement plate and glass substrate by collective packaging and separated into individual solid-state devices. This technique is characterized in that the solid-state image pick-up device board and glass substrate are designed to have their aligned edges and electrodes are extended out from the solid-state image pick-up device board 100 through the through-holed which penetrate through the reinforcement plate 701 pasted on the rear surface thereof. Further, a sealing cover glass 200 equipped a spacer 203S previously formed is employed.

First, an explanation will be given of the process of forming a spacer-equipped glass substrate.

Figure 8:
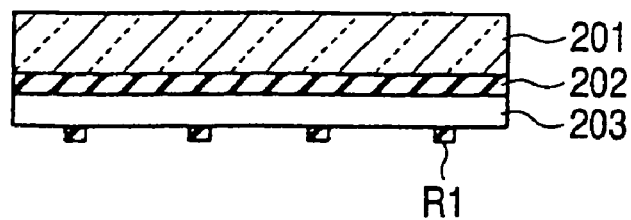
FIGS. 8(a) to 8(d) are views showing the steps for manufacturing the solid-state image pick-up device according to the seventh embodiment of this invention.
Figure 8:
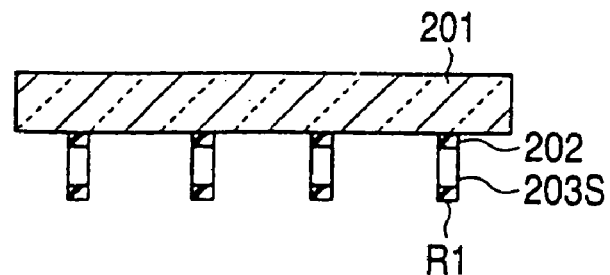
Figure 8:
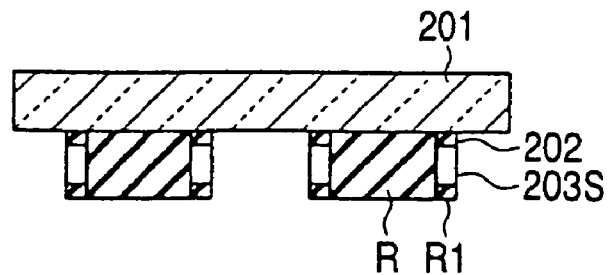
Figure 8:
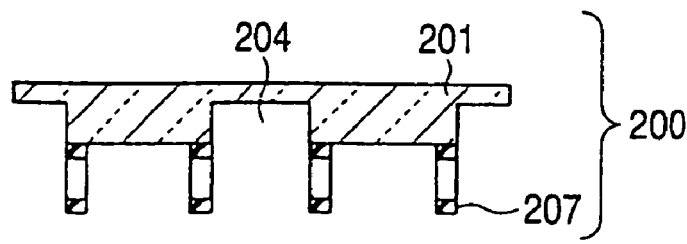

As seen from FIG. 8(a), a silicon substrate 203 which constitutes a spacer is put on the surface of a glass substrate 201 through an adhesive layer 203 which is made of an UV hardening adhesive (e.g. cation polymerizing energy adhesive). The portions of the silicon substrate which constitute spacers are covered with resist patterns R1. Incidentally, the adhesive layer may be other thermosetting adhesives.

As seen from FIG. 8(b), with the resist patterns left on the portions which constitute the spacers, the silicon substrate 203 is etched by photolithography, thereby forming the spacers 203S.

Thereafter, with the resist patterns R1 for forming the spacers S being left, the regions between the spacers except an inter-device region are filled with resist R. The glass substrate is etched to a prescribed depth to form an inter-device groove 204 as shown in FIG. 8(d). Adhesive layers 207 are formed on the surface of the spacers. In this embodiment, because the spacers 203 are made from the silicon substrate, as long as etching is performed under the condition that the etching speed of silicon oxide which is a main component of the glass substrate is much higher than that of the silicon, the etching may be performed with the side wall of the spacer being exposed to the inter-device region. The inter-device groove 204 may be formed using a dicing blade (grind stone).

By performing photolithography again, a resist pattern including the entire side wall of the spacer is formed and by performing the etching through the resist pattern, the groove 204 can be formed. In this way, the sealing cover glass 200 with the groove 204 and spacers 203 thus formed is manufactured.

Next, the solid-state image pick-up device board is formed. First, as seen from FIG. 9(a), a silicon substrate 101 (6 inch wafer is adopted in this embodiment) is prepared. On the surface of the silicon substrate 101, in regions corresponding to scribing lines employed in scribing the wafer into respective solid-state image pick-up devices, scribing grooves (not shown) are previously formed by the technique such as etching (although only one unit is illustrated, actually, a large number of solid-state image pick-up devices are successively formed). Further, by the ordinary silicon process, a device region inclusive of a channel stopper region, a channel region, charge transfer electrode is formed. By surface active normal temperature bonding, a reinforcement plate 701 which is a silicon substrate with a silicon oxide film formed thereon is bonded on the rear surface of the solid-state image pick-up device board 100 (FIG. 9(a)).

Figure 9:
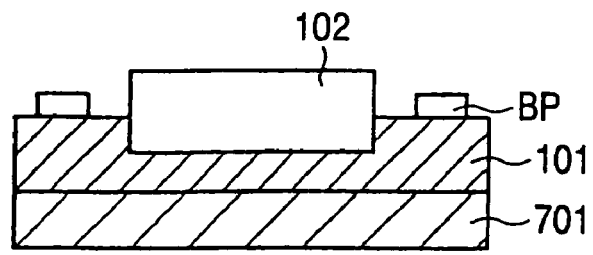
Figure 9:
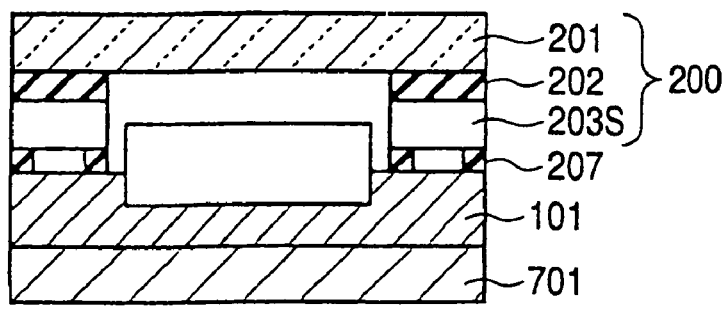
Figure 9:
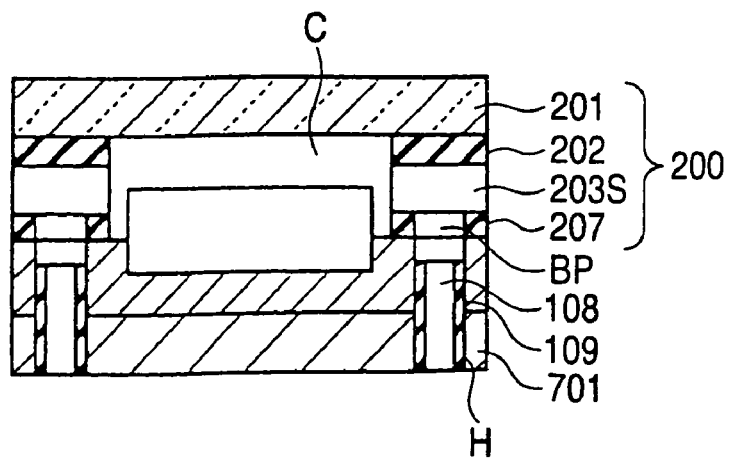

Thereafter, as seen from FIG. 9(b), alignment is made using an alignment mark formed on the peripheral edge of each wafer. Further, on the solid-state image pick-up device board 100 formed in the manner described above, a cover glass 200, which is composed of a plate-like glass substrate 201 and a spacer 203S bonded thereon, is placed. In this state, heating is done to unify the solid-state image pick-up device board 100 and cover glass 200 through an adhesive layer 207. This step is preferably performed in an atmosphere of inert gas such as nitrogen gas.

From the rear surface of the reinforcement plate 701, through-holes H are formed by photolithography. Within each of the through-holes H, a silicon oxide film 109 is formed by the CVD technique or thermal oxidation. Thereafter, anisotropic etching is carried out to leave the silicon oxide 109 on only the side wall of the through-hole H.

Figure 10:
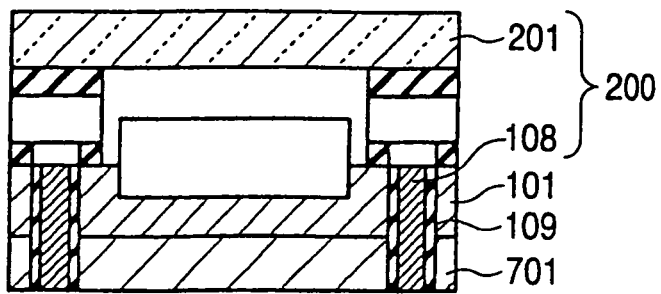
Figure 10:
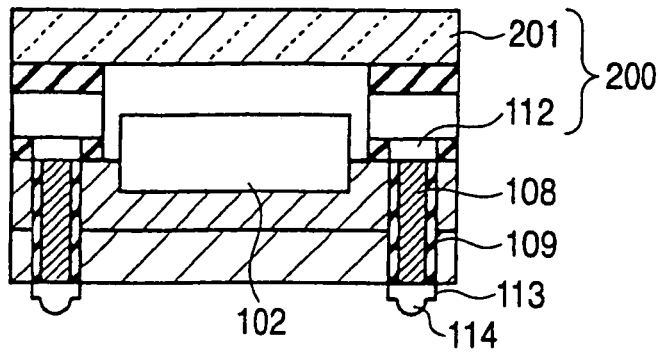
Figure 10:
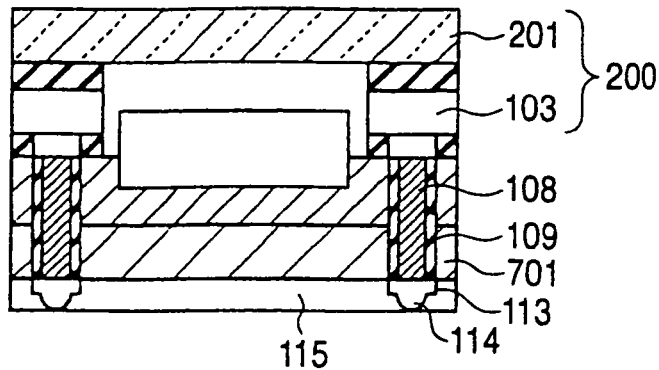
Figure 10:
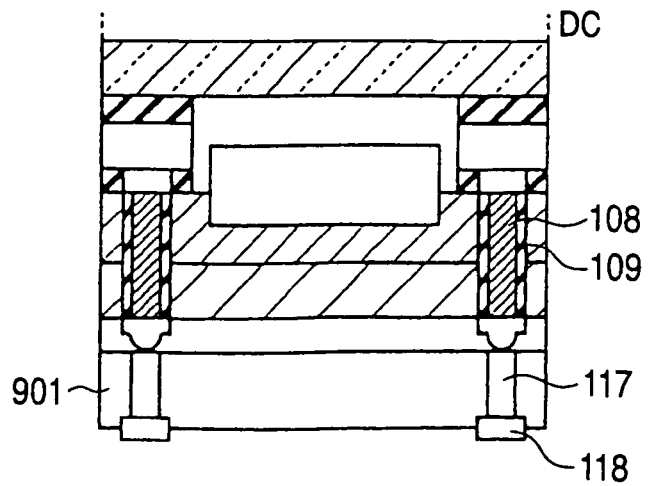

As seen from FIG. 10(a), by the CVD technique using $WF_6$, a tungsten film which serves as a conductor layer to be in contact with a bonding pad is formed within the through-hole H.

As seen from FIG. 10(b), on the surface of the reinforcement plate 701, a bump 114 as well as the bonding pad 113 is formed.

In this way, a signal extracting electrode terminal and an energizing electrode terminal can be formed on the reinforcement plate 701.

As seen from FIG. 10(c), an anisotropic conductive film 115 (ACP) is applied onto the surface of the reinforcement plate 701.

Finally, as seen from FIG. 10(d), a circuit board 901 with a driving circuit formed thereon is connected to the reinforcement plate 701 through the anisotropic conductive film 115. Incidentally, the circuit board 901 has through-holes H each filled with a contact layer 117 of a conductive layer and a bonding pad 118 coupled therewith.

Through the bonding pads 118, a circuit board such as a printed board can be connected to the contact layers 117. The contact layer 117 is aligned with the conductor layer 108 formed on the solid-state image pick-up device so that they are arranged on the same line.

Thereafter, the entire device is diced along dicing lines DC inclusive of the contact layer 117 and the conductor layer 108 arranged on the same line into individual image pick-up devices (although only one unit is illustrated, actually, plural solid-state image pick-up devices are successively formed on the single wafer.

In this way, the solid-state image pick-up device can be manufactured very easily and with good workability.

Incidentally, the reinforcement plate 701, which is a silicon substrate with a silicon oxide film containing a light shading material, permits heat insulation or electric insulation from the solid-state image pick-up device board 100.

In this embodiment, although the through-hole H is filled with a conductor layer by the CVD technique, it may be also filled with the conductor layer so as to have a high aspect ratio with improved workability by plating, vacuum screen printing or vacuum adsorption. Further, in this embodiment, using the through-holes, electric connection is made from the front and rear surfaces of the circuit board on which the solid-state image pick-up device board and peripheral circuit are mounted. However, the electric connection should not be limited to such a technique, but can be made by the technique of making electric contacts by diffusing impurities from the front and rear surfaces.

In this way, the signal extracting electrode terminal and the energizing electrode terminal can be formed on the side of the reinforcement plate 701.

Further, alignment or electric connection such as wire bonding is not made for each image pick-up device, but the entire wafer is packaged and thereafter diced into individual image pick-up devices. For this reason, the image pick-up devices can be easily manufactured and easily handled.

Further, the groove 204 is previously made in the glass substrate 201, and after packaging, the glass substrate 201 is diced by the technique of CMP (chemical mechanical polishing) to the depth reaching the glass substrate from the front surface. Therefore, the glass substrate can be easily diced.

With a device forming plane sealed within the gap C by bonding, the individual solid-state image pick-up device can be manufactured by only dicing or gliding so that a reliable solid-state image pick-up device while suffering from less damage.

Since the silicon substrate is reduced in thickness to ½ by the technique of CMP, the image pick-up device can be downsized and low-profiled. Further, the silicon substrate, after bonded to the glass substrate, is low-profiled so that its mechanical strength can be prevented from being reduced.

In accordance with this invention, the wafer is subjected to positioning and unified with other members by collective packaging and separated into individual solid-state image pick-up devices. For this reason, the solid-state image pick-up devices with high reliability can be easily manufactured.

In this embodiment, the solid-state image pick-up devices can be manufactured through the collective connection and dicing by the technique of CSP. However, the solid-state image pick-up device substrate 100 with the through-holes H and bumps is diced into individual device units and the sealing cover glass 200 may be fixed to each device.

The micro-lens array can be manufactured in such a manner that with a transparent resin film formed on a substrate surface, ion migration is made from the surface to form a lens layer having a gradient of refraction index at a prescribed depth.

The material of the spacer can be selected suitably. For example, glass, polycarbonate, etc. may be employed in place of the silicon substrate.

Further, where the entire reinforcement plate 701 is made of a light-shading material, the reflection light from the rear surface can be completely suppressed. The influence on the output of the solid-state image pick-up device, being caused by the light reflected from the rear surface, can be also suppressed by forming the unevenness on the rear surface of the solid-state image pick-up device, such as by grinding the rear surface thereof. The light-shading film such as a tungsten film formed on the rear surface of the solid-state image pick-up device through the oxide film may be employed as a supporting member.

Further, a multi-layer film may be formed on the rear surface of the solid-state image pick-up device. This also suppresses the influence of the light reflected from the rear surface on the output of the solid-state image pick-up device.

In addition, light shading resin such as epoxy resin may be applied to the rear surface of the solid-state image pick-up device.

Preferably, the supporting member includes a shielding plate so that the noise due to undesired radiation can be suppressed.

Preferably, the semiconductor substrate is bonded to the peripheral circuit substrate through a magnetic shielding plate so that the solid-state image pick-up device board can be prevented from suffering from the noise due to undesired radiation from the peripheral circuit substrate, and vice verse.

In the above seventh embodiment, the bonding between the solid-state image pick-up device and the sealing cover glass was made by using the adhesive layer. The bonding should not be limited to such a method, but can be made also by the techniques of direct bonding/surface activation normal temperature bonding, and pouring mold resin.

Where the solid-state image pick-up device and the sealing cover glass are bonded using the adhesive layer, a concave portion (liquid reservoir) is preferably formed in the bonding area to prevent the molten adhesive layer from flowing out.

This invention should not be applied to only the solid-state image pick-up device explained in the embodiments described hitherto, but can be applied to the other semiconductor devices including a photoelectric conversion device such as an optical sensor.

As understood from the description hitherto made, in accordance with this invention, a solid-state image pick-up device can be provided which is compact, generates less malfunction and provide high reliability.

In accordance with the method by this method, positioning is made in the level of a wafer; the solid-state image pick-up device board, supporting member and translucent member are collectively packaged to be unified, and thereafter, and the solid-state image pick-up device is separated into individual solid-state devices. Thus, the image pick-up device can be easily manufactured and positioned with high precision.

What is claimed is:

1. A method for manufacturing a semiconductor device comprising the steps of:
   a forming step for forming a plurality of semiconductor devices on the front surface of a semiconductor substrate;

a bonding step for bonding a wiring board on the rear surface of said semiconductor substrate;

a separating step for separating a bonding structure, obtained by bonding, into semiconductor devices; and a grinding step for forming a rough surface on the rear surface of the semiconductor substrate to reflect light away from the rear surface.

2. A method for manufacturing a semiconductor device comprising the steps of:

a forming step for forming a plurality of semiconductor devices on the front surface of a semiconductor substrate;

a bonding step for bonding a wiring board on the rear surface of said semiconductor substrate using light-shading adhesive provided between the wiring board and the semiconductor substrate and the light-shading adhesive suppressing light reflected from the rear surface of the semiconductor substrate from reaching the semiconductor device; and a separating step for separating a bonding structure obtained by bonding, into said semiconductor devices.

* * * * *